US010277389B2

(12) United States Patent
Terlemez et al.

(10) Patent No.: US 10,277,389 B2
(45) Date of Patent: Apr. 30, 2019

(54) PHASE DETECTORS FOR CLOCK AND DATA RECOVERY

(71) Applicant: ANALOG DEVICES GLOBAL, Hamilton (BM)

(72) Inventors: Bortecene Terlemez, Istanbul (TR); Burak Dundar, Istanbul (TR)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/655,703

(22) Filed: Jul. 20, 2017

(65) Prior Publication Data

US 2018/0302214 A1 Oct. 18, 2018

Related U.S. Application Data

(60) Provisional application No. 62/485,667, filed on Apr. 14, 2017.

(51) Int. Cl.
*H04L 7/06* (2006.01)
*H04L 7/033* (2006.01)
(Continued)

(52) U.S. Cl.
CPC .......... *H04L 7/0334* (2013.01); *H03L 7/0807* (2013.01); *H03L 7/091* (2013.01);
(Continued)

(58) Field of Classification Search
CPC ... H04L 7/0334; H04L 7/0008; H04L 7/0331; H04L 7/06; H03L 7/0807; H03L 7/091
(Continued)

(56) References Cited

U.S. PATENT DOCUMENTS 6,831,491 B2   12/2004   Karlquist
8,699,649 B2 *  4/2014   Byun ..................... H03L 7/085
                                              375/358
(Continued)

FOREIGN PATENT DOCUMENTS

KR   10-1264276 B1   5/2013
TW   201547250 A     12/2015

OTHER PUBLICATIONS

"Clock Recovery from Random Binary Signals" Electronic Letters, vol. 11, No. 22, Oct. 30, 1975, 2 pages.
(Continued)

*Primary Examiner* — Michael R Neff
(74) *Attorney, Agent, or Firm* — Knobbe Martens Olson & Bear LLP

(57) ABSTRACT

Phase detectors for clock and data recovery circuits are provided herein. In certain implementations, a phase detector includes sampling circuitry that generates a plurality of samples of an input data signal based on timing of a plurality of clock signals, a binary response circuit that processes the plurality of samples to generate a plurality of binary output signals providing a binary detector response, and a linear response circuit that processes the plurality of samples to generate a plurality of linear output signals providing a linear detector response. The phase detector generates one or more data output signals based on the plurality of samples to thereby recover data from the input data signal.

20 Claims, 10 Drawing Sheets

(51) Int. Cl.
*H04L 7/00* (2006.01)
*H03L 7/08* (2006.01)
*H03L 7/091* (2006.01)

(52) U.S. Cl.
CPC .......... *H04L 7/0008* (2013.01); *H04L 7/0331* (2013.01); *H04L 7/06* (2013.01)

(58) Field of Classification Search
USPC ....................................................... 375/355
See application file for complete search history.

(56) References Cited

U.S. PATENT DOCUMENTS

| | | | |
|---|---|---|---|
| 9,036,764 B1* | 5/2015 | Hossain | H03L 7/087 375/355 |
| 2006/0140323 A1* | 6/2006 | Eldredge | H03D 13/004 375/376 |
| 2016/0013927 A1* | 1/2016 | Lee | H04L 7/033 375/371 |

OTHER PUBLICATIONS

Li et al., "A New Hybrid Phase Detector for Reduced Lock Time and Timing Jitter of Phase-Locked Loops" Analog Integrated Circuits and Signal Processing, Springer Link, vol. 56, Issue 3, Sep. 2008, 8 pages.

Rezayee et al., "A 9-16Gb/s Clock and Data Recovery Circuit with Three-State Phase Detector and Dual-Path Loop Architecture" IEEE, 2003, 4 pages.

Savoj et al., "A 10-Gb/s CMOS Clock and Data Recovery Circuit with a Half-Rate Linear Phase Detector" IEEE Journal of Solid-State Circuits, vol. 36, No. 5, May 2001, 8 pages.

Sidiropoulos et al., "A Semi-Digital Dual Delay Locked Loop" IEEE Journal of Solid-State Circuits, vol. 32, No. 11, Nov. 1997, 11 pages.

Ware et al., "A 200-MHz CMOS Phase-Locked Loop with Dual Phase Detectors" IEEE Journal of Solid-State Circuits, vol. 24, Issue 6, Dec. 1989, 9 pages.

* cited by examiner

PHASE DETECTORS FOR CLOCK AND DATA RECOVERY

CROSS-REFERENCE TO RELATED APPLICATIONS

The present application claims priority to U.S. Provisional Patent Application No. 62/485,667, filed Apr. 14, 2017, and titled "PHASE DETECTORS FOR CLOCK AND DATA RECOVERY," the entirety of which is hereby incorporated herein by reference.

FIELD OF THE DISCLOSURE

Embodiments of the invention relate to electronic devices, and more particularly, to phase detectors for clock and data recovery circuits.

BACKGROUND

Clock and data recovery (CDR) circuits can be used in a variety of applications for recovering data from a high-speed serial data stream.

In one example, a CDR circuit is used in an optical transceiver to provide retiming. In another example, a chip-to-chip communication system includes two or more serial communication links or lanes used to communicate data from a first integrated circuit (IC) or chip to a second IC. Additionally, each lane can include a CDR circuit for recovering data from an input data stream received over the lane.

SUMMARY OF THE DISCLOSURE

Phase detectors for clock and data recovery are provided herein. In certain implementations, a phase detector includes sampling circuitry that generates samples of an input data stream. The phase detector processes the samples to provide a binary response, to provide a linear response, and to recover data from the input data stream. Thus, the phase detector is used for a myriad of functions, including data recovery and generating detector responses for controlling clock timing.

In one aspect, a phase detector for a clock and data recovery (CDR) circuit is provided. The phase detector includes sampling circuitry configured to generate a plurality of samples of an input data signal based on timing of a plurality of clock signals, a binary response circuit configured to process the plurality of samples to generate a plurality of binary output signals providing a binary detector response, and a linear response circuit configured to process the plurality of samples to generate a plurality of linear output signals providing a linear detector response. The phase detector is configured to generate one or more data output signals based on the plurality of samples to thereby recover data from the input data signal.

In another aspect, a CDR circuit is provided. The CDR circuit includes a phase detector including sampling circuitry configured to generate a plurality of samples of an input data signal based on timing of a plurality of clock signals, a binary response circuit configured to process the plurality of samples to generate a plurality of binary output signals providing a binary detector response, and a linear response circuit configured to process the plurality of samples to generate a plurality of linear output signals providing a linear detector response. The phase detector is configured to generate one or more data output signals based on the plurality of samples. The CDR circuit further includes a controllable oscillator having a frequency of oscillation controlled by the plurality of binary output signals and the plurality of linear output signals.

In another aspect, a method of clock and data recovery is provided. The method includes generating a plurality of samples of an input data signal based on timing of a plurality of clock signals using sampling circuitry, processing the plurality of samples to generate a binary detector response, processing the plurality of samples to generate a linear detector response, controlling a frequency of oscillation of a controllable oscillator based on the binary detector response and the linear detector response, and recovering data from the input data signal by generating one or more data output signals based on the plurality of samples.

DETAILED DESCRIPTION OF EMBODIMENTS

Figure 1:
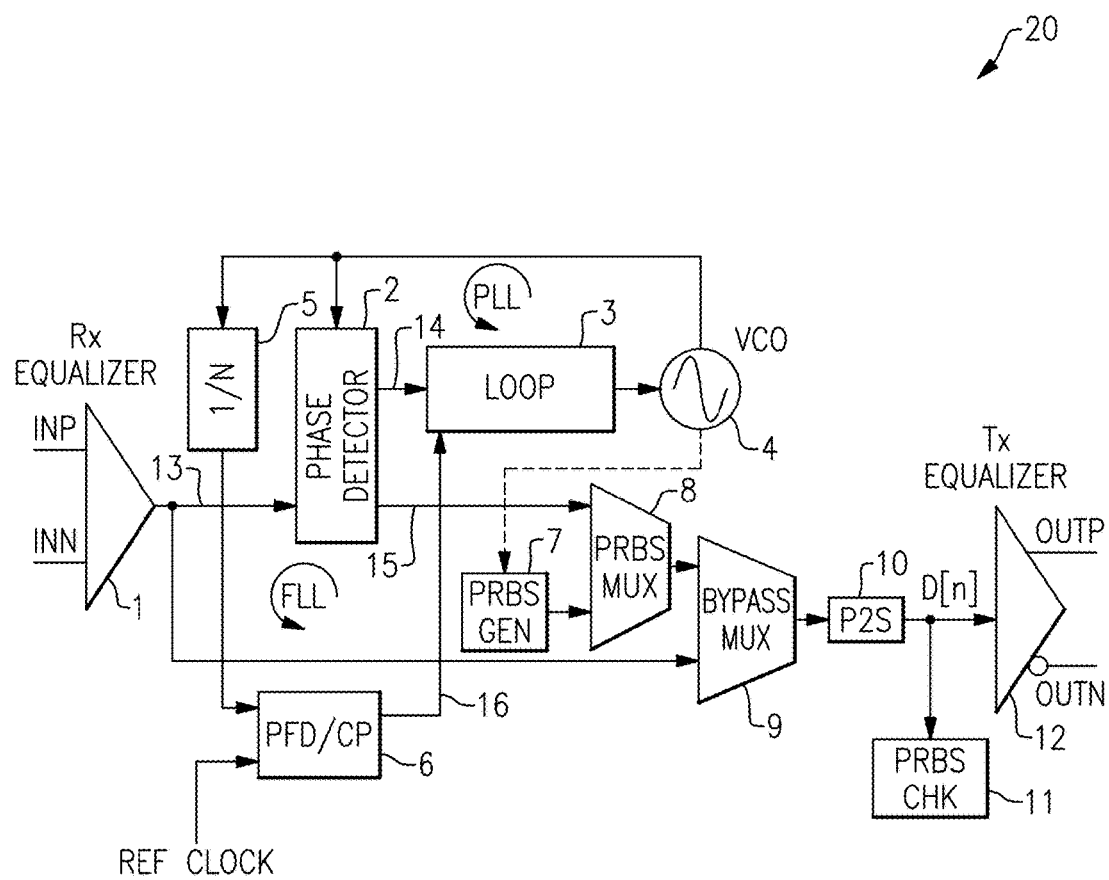
FIG. 1 is a schematic diagram of one embodiment of a retiming system including a clock and data recovery (CDR) circuit.

Various aspects of the novel systems, apparatuses, and methods are described more fully hereinafter with reference to the accompanying drawings. Aspects of this disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art.

Based on the teachings herein, one skilled in the art should appreciate that the scope of the disclosure is intended to cover any aspect of the novel systems, apparatuses, and methods disclosed herein, whether implemented independently of or combined with any other aspect. For example, an apparatus may be implemented or a method may be practiced using any number of the aspects set forth herein. Thus, it will be understood that certain embodiments can include more elements than illustrated in a drawing and/or a subset of the elements illustrated in a drawing. Further, some embodiments can incorporate any suitable combination of features from two or more drawings. In addition, the scope is intended to encompass such an apparatus or method which is practiced using other structure, functionality, or structure and functionality in addition to or other than the various aspects set forth herein. It should be understood that any aspect disclosed herein may be embodied by one or more elements of a claim.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to a variety of electronic systems. The detailed description and drawings are merely illustrative of the disclosure rather than limiting, the scope of the disclosure being defined by the appended claims.

A clock and data recover (CDR) circuit can be used to retime a serial input data stream.

In one example, CDR circuits serve as signal conditioners that retime data received by an optical module to compensate for losses in the transmission medium. For instance, quadrature CDR circuits can be provided for retiming optical receive signals associated with in-phase (I) and quadrature-phase (Q) signals for both horizontal and vertical polarizations. Such optical modules can include, but are not limited to, optical transceiver modules operating at 100 Gb/s or higher for Ethernet, OTN, 4×25 G CFP2/4, and/or CEI-28G-VSR applications.

An input data signal or stream received by a CDR circuit can include a string of serial data bits that transition at a data rate. At a given data rate, the input data has a unit interval (UI), or minimum time interval between transitions of the input data stream.

A half-rate CDR circuit operates with a clock signal that is about half the data rate of the input data stream when the CDR circuit is in lock. For example, the half-rate CDR circuit can include a voltage controlled oscillator (VCO) or other controllable oscillator that oscillates at about half the input data rate when the CDR circuit is locked to the input data stream.

Since clock power is a significant component of the CDR circuit's overall power dissipation, half-rate CDR circuits can operate with lower power consumption relative to full-rate CDR circuits. Furthermore, half-rate CDR circuits can exhibit relatively low jitter.

A phase detector of a half-rate CDR circuit samples the input data stream based on timing of an in-phase (I) clock signal and a quadrature-phase (Q) clock signal. The phase detector generates error signals that are processed using a feedback loop to align the I and Q clock signals relative to the UI of the input data stream.

One type of phase detector is a linear phase detector. CDR circuits that operate with a linear phase detector can generate retimed data signals with relatively low jitter, but can also have relatively poor jitter tolerance (for instance, poor tolerance to perturbations in an output phase of a VCO).

Another type of phase detector is a binary or bang-bang phase detector. CDR circuits that operate with a binary phase detector can have relatively robust jitter tolerance, but can undesirably generate retimed output data signals with relatively high jitter.

In certain implementations herein, a CDR circuit includes a phase detector that provides both a binary response and a linear response, and thus serves as both a binary phase detector and as a linear phase detector. Furthermore, the phase detector includes shared sampling circuitry (for example, shared latches) used to generate the binary response, the linear response, and to recover data from the input data stream. Thus, the phase detector is used for a myriad of functions, including data recovery and generating detector responses for controlling clock timing.

The binary response and the linear response can be collectively used in the CDR circuit to control a common VCO or other controllable oscillator, thereby achieving the combined benefits of high jitter tolerance and low jitter generation for retimed data signals. Thus, the phase detector exhibits relatively low power consumption relative to an implementation with a separate binary phase detector and a separate linear phase detector. Moreover, implementations with discrete binary and linear detectors can suffer from errors arising from mismatches.

The sampling circuitry can be implemented in a wide variety of ways, such as by using latches, flip-flops and/or other circuitry suitable for capturing samples from an input data signal. Additionally, the binary response circuit and the linear response circuit can be implemented in a wide variety of ways, such as by using digital logic gates implemented to provide logical operations on the samples to generate the detector responses.

FIG. 1 is a schematic diagram of one embodiment of a retiming system 20. The retiming system 20 includes a receive equalizer 1, a dual-response phase detector 2, a loop filter 3, a VCO 4, a 1/N divider 5, a phase-frequency detector and charge pump (PFD/CP) 6, a pseudo-random binary sequence (PRBS) generator 7, a PRBS multiplexer (MUX) 8, a bypass multiplexer 9, a parallel to series (P2S) circuit 10, a PRBS checker 11, and a transmit equalizer 12.

Although FIG. 1 illustrates one embodiment of a retiming system, the teachings herein are applicable to retiming systems implemented in a wide variety of ways.

The receive equalizer 1 can provide equalization (for instance, linear adaptive equalization) to a differential input signal INP, INN to generate a serial input data stream 13. The serial input data stream 13 is provided to the dual-response phase detector 2, which is implemented in accordance with one or more features of the present disclosure.

Although FIG. 1 illustrates one example of an electronic system that can include a phase detector implemented in accordance with the teachings herein, phase detectors that provide both linear and binary responses and recover data can be used in a wide variety of electronic systems.

The dual-response phase detector 2, the loop filter 3, and the VCO 4 operate in a phase-locking loop (PLL) of a CDR circuit. The dual-response phase detector 2 generates both binary and linear responses 14 (collectively represented using a single arrow in FIG. 1) that are used to control an oscillation frequency of the VCO 4 to align the VCO's clock signal relative to the UI of the input data stream 13. The dual-response phase detector 2 is also used to recover output data 15 from the serial input data stream 13.

The illustrated retiming system 20 includes the PFD/CP 6, which operates as part of a frequency locking loop (FLL). The PFD/CP 6 generates a PFD/CP error signal 16 based on comparing a divided version of the VCO's clock signal to a reference clock signal (REF CLOCK). The PFD/CP error signal 16 is provided to the loop filter, and also can be used to adjust the VCO's frequency. Thus, the oscillation frequency of the VCO 4 is controlled by the binary and linear responses 14 and by the PFD/CP error signal 16, in this embodiment.

The FLL serves to provide frequency tuning to control the VCO's frequency relatively close to a frequency suitable for clock and data recovery. Once the FLL achieves suitable frequency adjustment, the PLL loop takes over to align the VCO's clock signal to the input data stream 13, thereby achieving lock. Accordingly, the illustrated retiming system 20 is a dual loop system.

The dual-response phase detector 2 generates output data 15 (for example, an even output signal and an odd output signal), which is retimed relative to the input data stream 13. The PRBS multiplexer 8 and the bypass multiplexer 9 can be used to provide the retimed output signals to the P2S circuit 10, which generates a serial output data stream D[n] that is processed by the transmit equalizer 12 to generate a differential output signal OUTP, OUTN. In the illustrated embodiment, the retiming system 20 includes the PRBS generator 7 and the PRBS checker 11 to realize built-in self-test (BIST) functionality.

In certain implementations, one or more instantiations of the retiming system 20 are included on a semiconductor die. For example, the retiming system 20 can correspond to one channel of quadrature CDR system used to retime optical receive data of an optical transceiver module.

In one embodiment, at least four instantiations of the retiming system 20 are included on a common semiconductor die. In certain implementations, the PFD/CP of each CDR channel operates with a shared reference clock signal (REF CLOCK). The reference clock signal (REF CLOCK) can be any suitable frequency, for instance, 1/32, 1/64 or 1/128 of the data rate of the input data stream.

Figure 2:
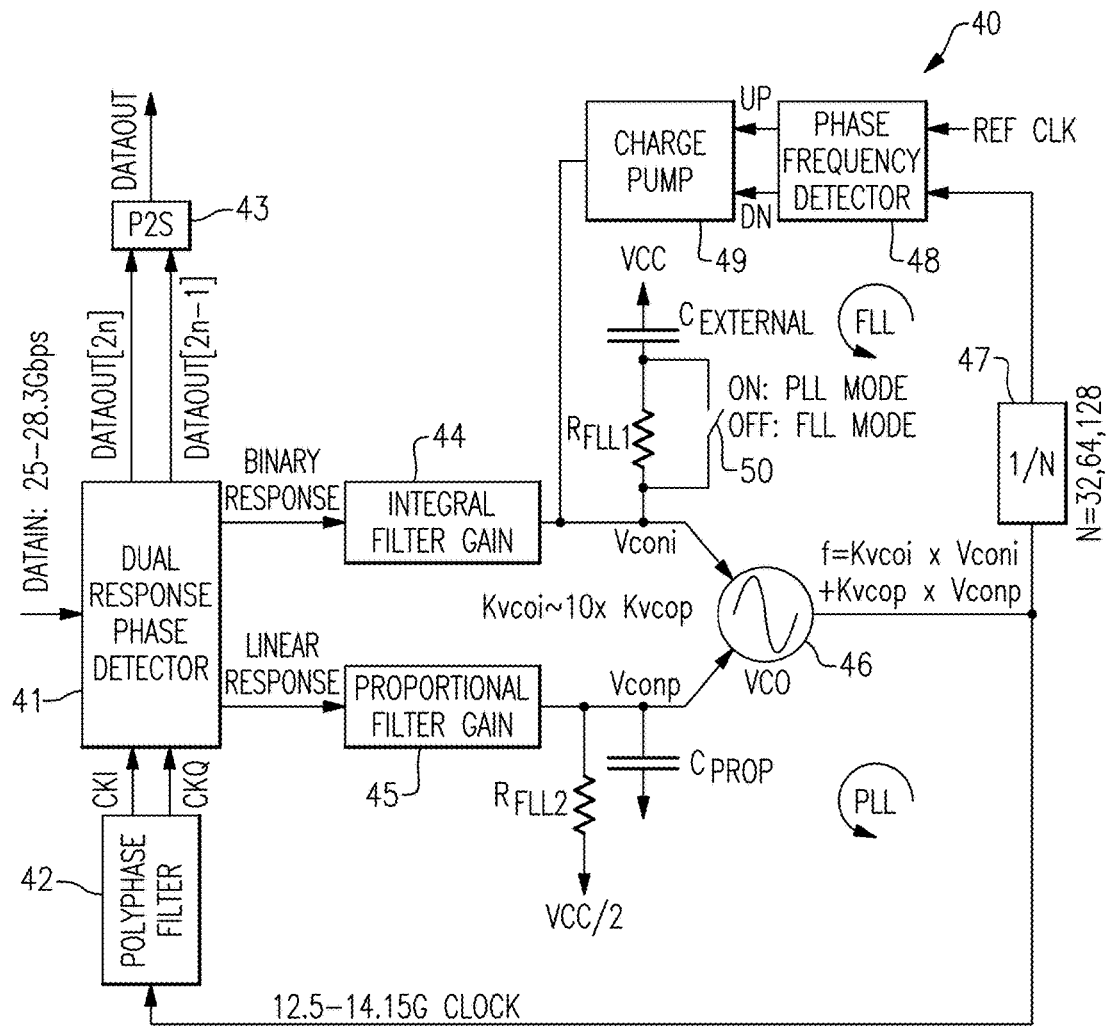
FIG. 2 is a schematic diagram of one embodiment of a CDR circuit for a retiming system.

FIG. 2 is a schematic diagram of one embodiment of a CDR circuit 40 for a retiming system, such as the retiming system 20 of FIG. 1. The CDR circuit 40 includes a dual-response phase detector 41, a polyphase filter 42, a P2S circuit 43, an integral filter gain circuit 44, a proportional filter gain circuit 45, a VCO 46, a 1/N divider 47, a phase frequency detector (PFD) 48, a charge pump (CP) 49, a first FLL resistor $R_{FLL1}$, a second FLL resistor $R_{FLL2}$, an integral filter capacitor $C_{EXTERNAL}$, a proportional filter capacitor $C_{PROP}$, and a switch 50. The CDR circuit 40 of FIG. 2 illustrates one example of suitable CDR circuitry for the retiming system 20 of FIG. 1.

Although FIG. 2 illustrates one embodiment of a CDR circuit, the teachings herein are applicable to CDR circuits implemented in a wide variety of ways. Furthermore, although various example values of data rates, frequencies, and frequency control gains have been annotated in FIG. 2, the teachings herein are applicable to a wide variety of parameter values.

The dual-response phase detector 41 receives a serial input data stream DATAIN, which can have a relatively fast data rate, for instance 25 Gbps or more. The dual-response phase detector 41 serves to retime the input data stream DATAIN to generate an even output signal (DATAOUT[2n]) and an odd output signal (DATAOUT[2n−1]). The even output signal (DATAOUT [2n]) and the odd output signal (DATAOUT [2n−1]) are processed by the P2S circuit 43 to generate the serial data output signal DATAOUT.

In the illustrated embodiment, the dual-response phase detector 41 samples the input data stream DATAIN based on timing of an I clock signal CKI and a Q clock signal CKQ. The dual-response phase detector 41 processes the samples to provide both a binary response and a linear response. The binary response includes binary output signals that are provided to the integral filter gain circuit 44, and the linear response includes linear output signals that are provided to the proportional filter gain circuit 45.

As shown in FIG. 2, the binary response and the linear response are collectively used in the CDR circuit 40 to control a common VCO 46, thereby achieving the combined benefits of high jitter tolerance and low jitter generation for the retimed even and odd output signals.

The PFD 48 and CP 49 operate as part of a FLL that generates an error signal based on comparing a divided clock from the divider 47 to a reference clock signal (REF CLK). The error signal is provided to the integral loop filter (corresponding to the first FLL resistor $R_{FLL1}$, the integral filter capacitor $C_{EXTERNAL}$, and the switch 50, in this example) to adjust the VCO's frequency. The FLL serves to provide frequency tuning to control the VCO's frequency relatively close to a frequency suitable for clock and data recovery. Once the FLL achieves suitable frequency adjustment, the PLL loop takes over to align the VCO's clock signal to the input data stream DATAIN, thereby achieving lock.

As shown in FIG. 2, the VCO's clock signal is provided to the polyphase filter 42, which processes the VCO'-s clock signal to generate the I clock signal CKI and the Q clock signal CKQ.

In the illustrated embodiment, the first FLL resistor $R_{FLL1}$ is included in the integral loop filter when in the FLL mode and is bypassed in the PLL mode. The bypassing operation is provided via the switch 50. Implementing the CDR circuit 40 in this manner provides enhanced stability in the FLL mode and enhanced loop performance in the PLL mode when the VCO frequency is locked.

During the PLL mode, the VCO's oscillation frequency is controlled using both a fine control input and a coarse control input. The fine control input provides lower VCO frequency control gain (for instance, lower $K_{VCO}$) relative to the coarse control input. For instance, in one embodiment, the coarse control input provides at least about 10 times the $K_{VCO}$ as the fine control input. However, other frequency control gain values are possible. $K_{VCO}$ corresponds to a change in the VCO's oscillation frequency for a given change in the voltage level of a frequency control input.

As shown in FIG. 2, the linear output signals from the phase detector 41 provide fine control of the VCO 46. Thus, the phase detector's linear response controls the proportional path, which can provide relatively robust loop dynamics associated with a well-defined linear phase detector response. Additionally, the binary output signals from the phase detector provide coarse control of the VCO. Thus, the phase detector's binary response controls the integral path with larger VCO gain to provide robust control over alignment of the clock signals CKI and CKQ relative to the UI of the input data stream.

Accordingly, the CDR circuit 40 of FIG. 2 provides the advantages of both binary and linear phase detection. For example, the binary response of the phase detector provides high VCO gain to align the sampling clock signals at a sampling point of the input data eye to provide high jitter tolerance. At the same time, the linear response provides the proportional error voltage, hence maintaining well-defined and stable loop dynamics.

The CDR circuit 40 of FIG. 2 also provides relatively low spur levels at the CDR output. For example, the integral path can include a relatively large filter capacitance (for instance, a large external capacitor) which in combination with the proportional path provides lower VCO gain and achieves very low spur levels at the output. Moreover, the proportional path is driven to lock relatively close to a mid-supply voltage level, thereby operating the proportional filter gain circuit 45 at a desirable operating point.

Figure 3:
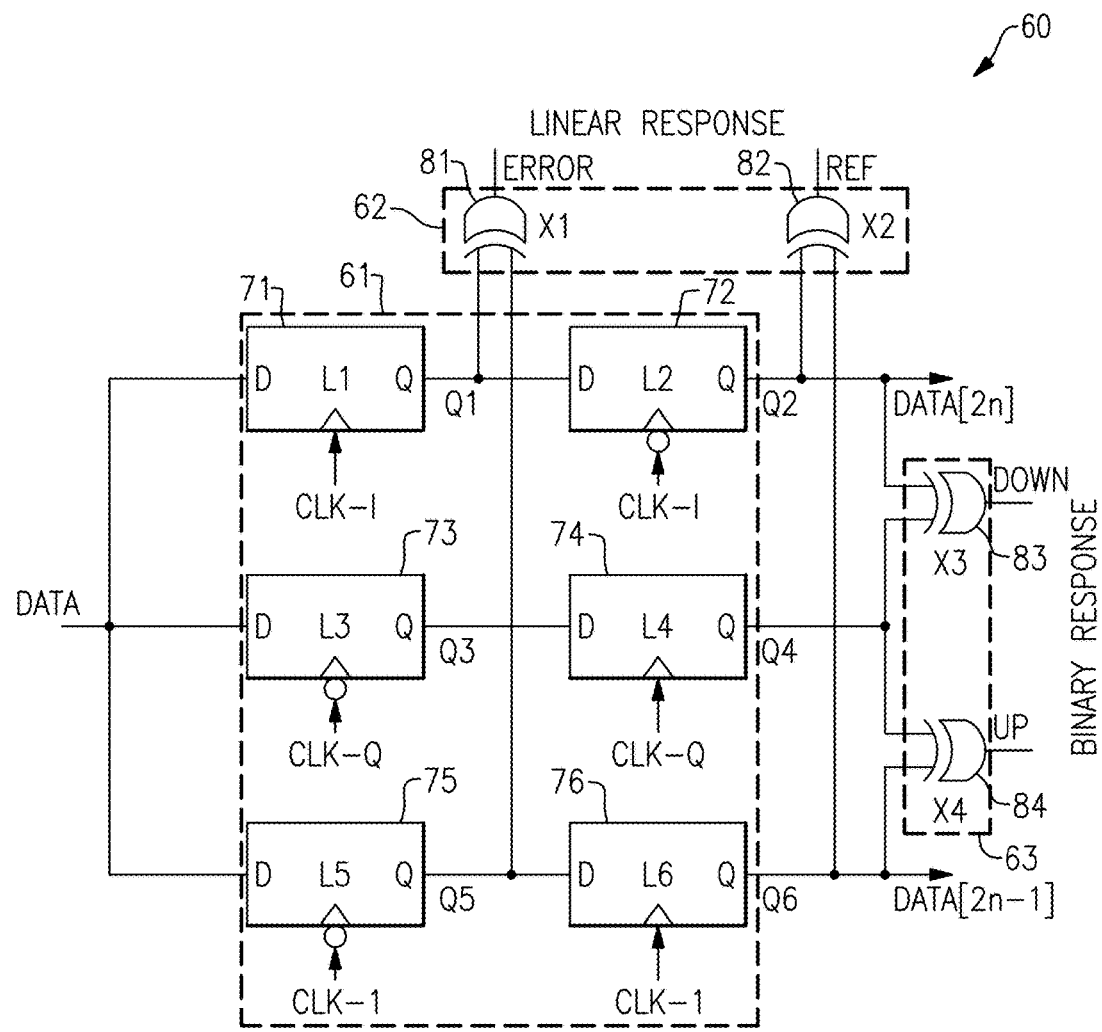
FIG. 3 is a schematic diagram of one embodiment of a dual-response phase detector.

FIG. 3 is a schematic diagram of one embodiment of a dual-response phase detector 60. The dual-response phase detector 60 includes sampling circuitry 61 including a first latch 71 (L1), a second latch 72 (L2), a third latch 73 (L3), a fourth latch 74 (L4), a fifth latch 75 (L5), and a sixth latch 76 (L6). The dual-response phase detector 60 further includes a linear response circuit 62 including a first exclusive OR (XOR) gate 81 (X1) and a second XOR gate 82 (X2), and a binary response circuit 63 including a third XOR gate 83 (X3), and a fourth XOR gate 84 (X4).

The dual-response phase detector 60 can be used in a wide variety of CDR circuits, including, but not limited to, the CDR circuits of FIGS. 1 and 2. The dual-response phase detector 60 illustrates one implementation of a half-rate phase detector that provides both linear and binary responses and recovers data from an input data stream.

As shown in FIG. 3, the dual-response phase detector 60 receives a full rate input data stream (DATA). The dual-response phase detector 60 generates and even output data signal (DATA[$2n$]) and an odd output data signal (DATA[$2n-1$]), each of which are retimed relative to the input data stream. In certain implementations, the dual-response phase detector 60 includes one or more inverters and/or other circuitry for buffering the output data signals.

The dual-response phase detector 60 of FIG. 3 provides both binary output signals and linear output signals. The binary output signals include an up signal UP and a down signal DOWN. The binary output signals are also referred to herein as a binary response. The linear output signals include an error output signal ERROR and a reference signal REF. The linear output signals are also referred to herein as a linear response.

In certain implementations, the dual-response phase detector 60 is used in a CDR circuit that employs both the binary response and linear response to control the oscillation frequency of the CDR circuit's VCO or other controllable oscillator. In other implementations, the CDR circuit is programmable to operate with the binary response, the linear response, or a combination thereof based on application. For instance, a selected response mode can be chosen based on specifications related to jitter generation, jitter tolerance, jitter transfer and/or pull-in behavior. In one example, a linear response has better jitter generation but poorer jitter tolerance, while a binary response has better jitter tolerance but poorer jitter generation.

Sampling of the dual-response phase detector 60 is controlled by an I clock signal CLK-I and a Q clock signal CLK-Q, which have a quadrature phase relationship corresponding to a phase separation of about 90°. When the CDR circuit that includes the dual-response phase detector 60 is locked to the input data stream, a rate of the I clock signal CLK-I and the Q clock signal CLK-Q is about half that of the input data stream.

The input data stream can include a string of serial data bits that transition at a data rate. At a given data rate, the input data stream has a UI corresponding to a minimum time interval between data transitions. The binary and linear responses of the dual-response phase detector 60 can be used by a CDR circuit to control alignment of the I clock signal CLK-Q and the Q clock signal CLK-Q relative to the UI, thereby generating the even output data signal and the odd output data signal based on samples taken from about the middle of the input data eye.

As shown in FIG. 3, the latches 71-76 (L1-L6) are controlled by either positive (rising) edges or negative (falling) edges of the I clock signal CLK-I and the Q clock signal CLK-Q. For example, the first latch 71 is triggered by a positive edge of the I clock signal CLK-I, the second latch 72 is triggered by a negative edge of the I clock signal CLK-I, the third latch 73 is triggered by a negative edge of the Q clock signal CLK-Q, the fourth latch 74 is triggered by a positive edge of the Q clock signal CLK-Q, the fifth latch 75 is triggered by a negative edge of the I clock signal CLK-I, and the sixth latch 76 is triggered by a positive edge of the I clock signal CLK-I.

The first to sixth latches 71-76 generate first to sixth latch output signals Q1-Q6, respectively. The first, third and fifth latches 71, 73 and 76 sample the input data stream based on timing of their respectively clock signals. Additionally, the second latch 72 samples the first latch output signal Q1, the fourth latch 74 samples the third latch output signal Q3, and the sixth latch 76 samples the fifth latch output Q5.

As shown in FIG. 3, the third and fourth XOR gates 83, 84 generate the binary response of the dual-response phase detector 60 based on values of the second latch output Q2, the fourth latch output Q4, and the sixth latch output Q6. Thus, the binary response is generated based on samples of the input data stream taken at a falling edge of the I clock signal CLK-I, at a rising edge of the Q clock signal CLK-Q, and at a rising edge of the I clock signal CLK-I.

When locked, both rising and falling edges of the I clock signal are aligned with the data transition and the quadrature clock edge is at about the center of the input data eye. Thus, the third and fourth XOR gates 83, 84 serve to perform exclusively or (XOR) operations of a sample taken from about the center of the UI with samples taken at the left and right edges of the UI. Thus, the binary outputs carry information of the data sampling edge lying to the left of its ideal position (early) or to the right of its ideal position (late).

With respect to the linear response, the first XOR gate 81 performs an XOR operation of the first latch output Q1 and the fifth latch output Q5 to produce proportional pulses. When locked, the error signal generated by the first XOR gate 81 is about a quarter of the clock period. Additionally, the pulse is shorter if the clock edge is to the left of the center of the UI and longer if to the right of the center of the UI. The second XOR gate 82 performs an XOR operation of the second latch output Q2 and the sixth latch output Q6 to generate a reference pulse that has a width of about half the clock period. This information can be used to evaluate the error pulse by doubling the error path gain with respect to the reference path, thereby achieving a linear phase detector characteristic.

The illustrated dual-response phase detector 60 includes a binary response circuit and a linear response circuit that generate binary and linear responses, respectively, based on samples captured by shared sampling circuitry. Furthermore, shared sampling circuitry is also used to recover the output data signals DATA[$2n$] and DATA[$2n-1$] Thus, the phase detector exhibits relatively low power consumption relative to an implementation with a discrete binary phase detector, a discrete linear phase detector, and/or separate data recovery circuitry.

Moreover, using shared sampling circuitry reduces mismatch errors relative to an implementation in which a discrete binary phase detector captures samples separately from a discrete linear phase detector.

Furthermore, the illustrated dual-response phase detector 60 exhibits reduced component count and thus lower area and/or power relative to an implementation using stand-alone binary and linear detectors. For example, the dual-response phase detector 60 of FIG. 3 is implemented with 6 latches and 4 XOR gates. In contrast, a separate half-rate binary detector can be implemented with 6 latches and 2 XOR gates, while a separate half-rate linear detector can be implemented with 4 latches and 2 XOR gates, or 10 latches and 4 XOR gates in total. Thus, in this specific example, the dual-response phase detector 60 operates with four fewer latches relative to an implementation with a discrete binary phase detector and a discrete linear phase detector.

Figure 4A:
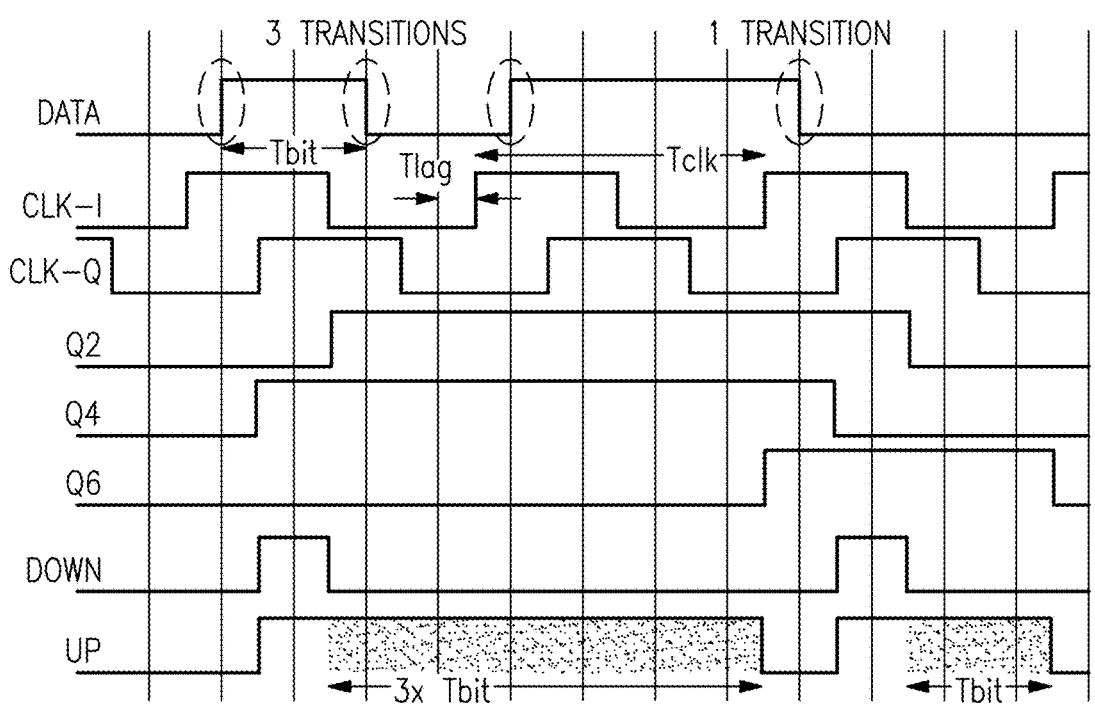
FIGS. 4A-4C are graphs of one example of a binary response of the dual-response phase detector of FIG. 3.
Figure 4B:
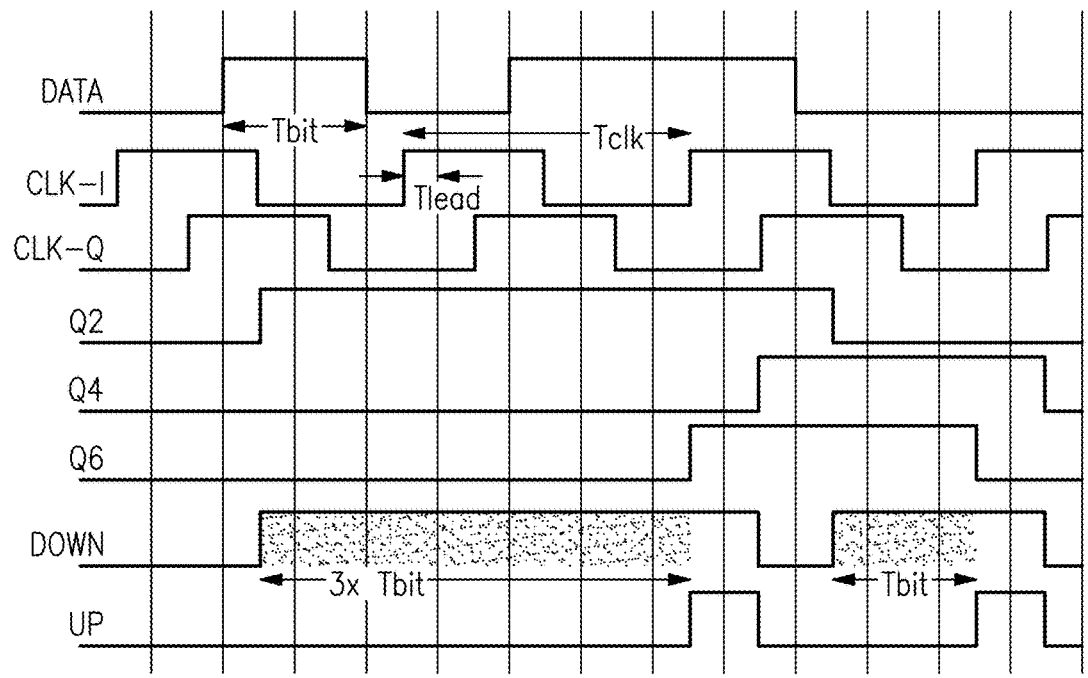
Figure 4C:
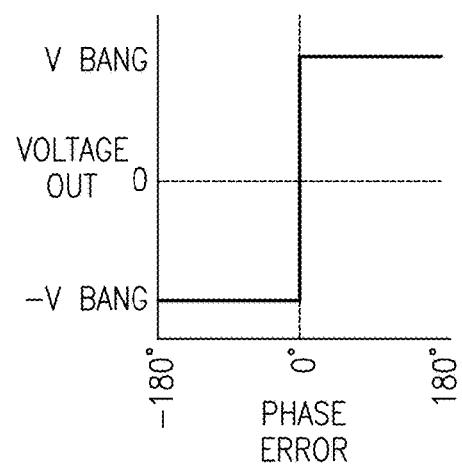

FIG. 4A-4C are graphs of one example of a binary response for the dual-response phase detector 60 of FIG. 3. FIG. 4A is a graph of a lagging clock binary response. Additionally, FIG. 4B is a graph of a leading clock binary response. Furthermore, FIG. 4C is a graph of phase error versus output voltage for the binary response.

Figure 5A:
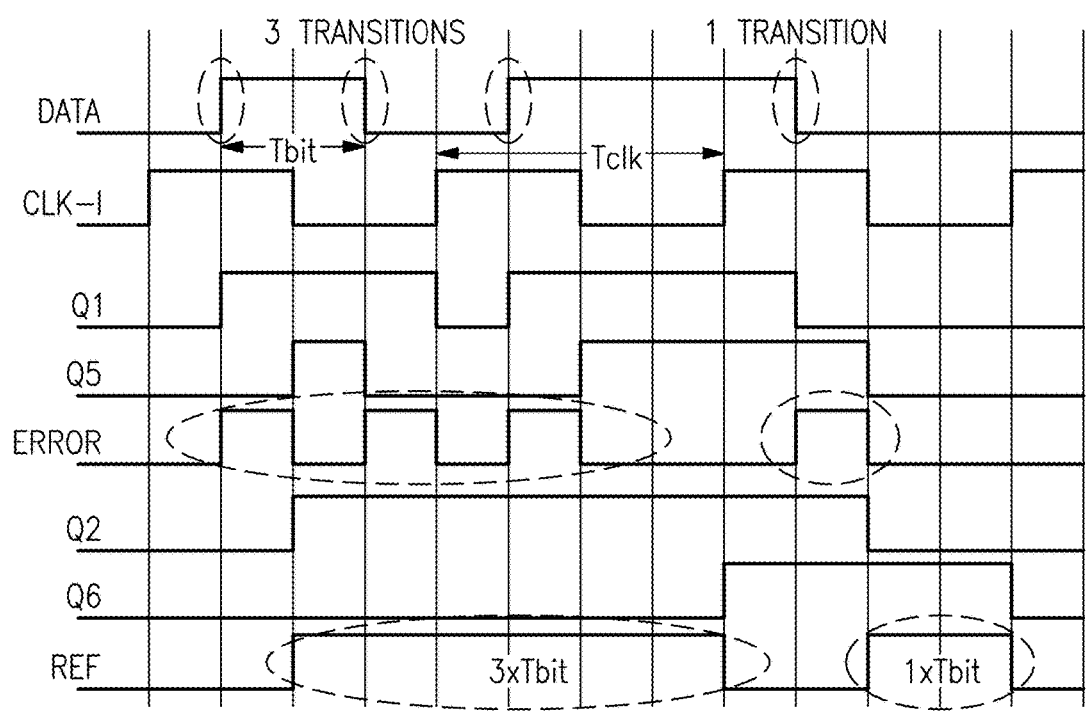
FIGS. 5A-5D are graphs of one example of a linear response of the dual-response phase detector of FIG. 3.
Figure 5B:
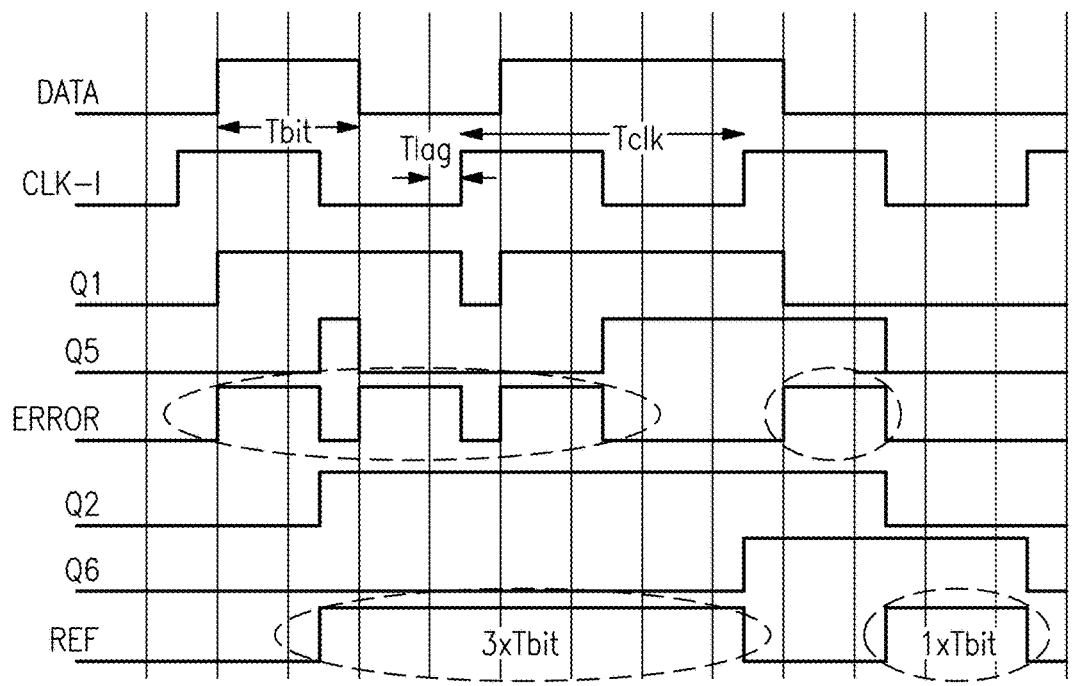
Figure 5C:
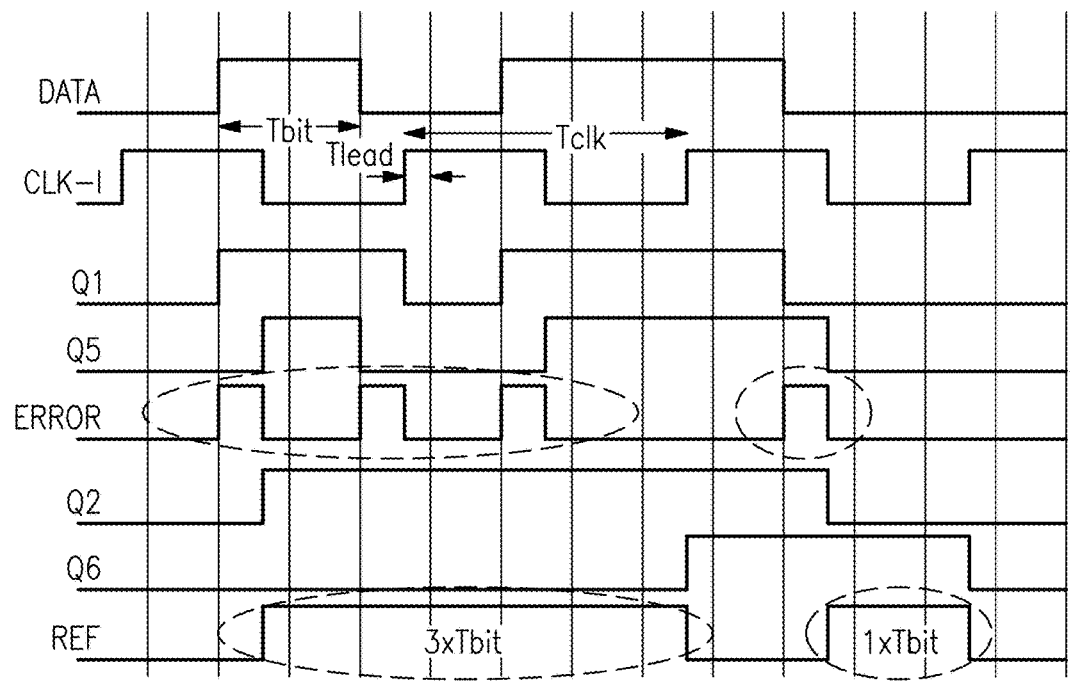
Figure 5D:
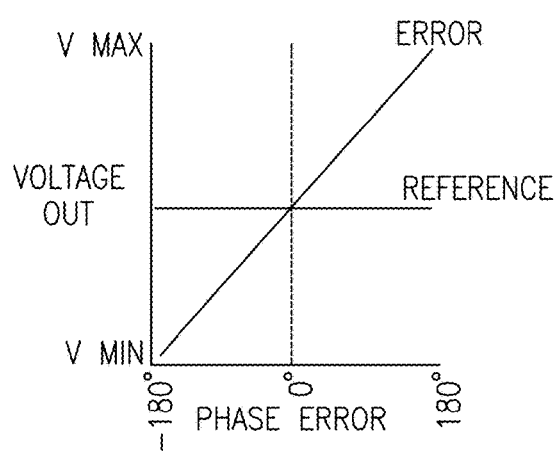

FIGS. 5A-5D are graphs of one example of a linear response of the dual-response phase detector 60 of FIG. 3. FIG. 5A is a graph of in-phase clock linear response corresponding to a locked condition. Additionally, FIG. 5B is a graph of lagging clock linear response. Furthermore, FIG. 5C is a graph of leading clock linear response. Additionally, FIG. 5D is a graph of phase error versus output voltage for the linear response.

Figure 6:
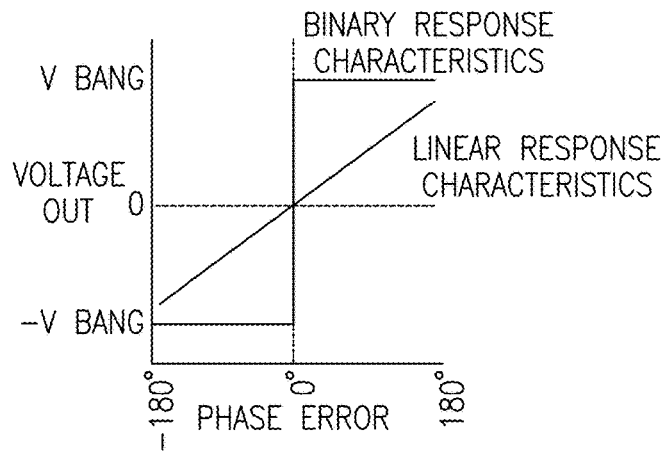
FIG. 6 is a graph of one example of binary and linear responses of the dual-response phase detector of FIG. 3.

FIG. 6 is a graph of one example of binary and linear responses of the dual-response phase detector of FIG. 3. FIG. 6 corresponds to a graph of phase error versus output voltage for both the binary and linear responses. However, other implementations are possible. For example, a scale of the binary response relative to the linear response can vary with downstream charge pump current.

Figure 7:
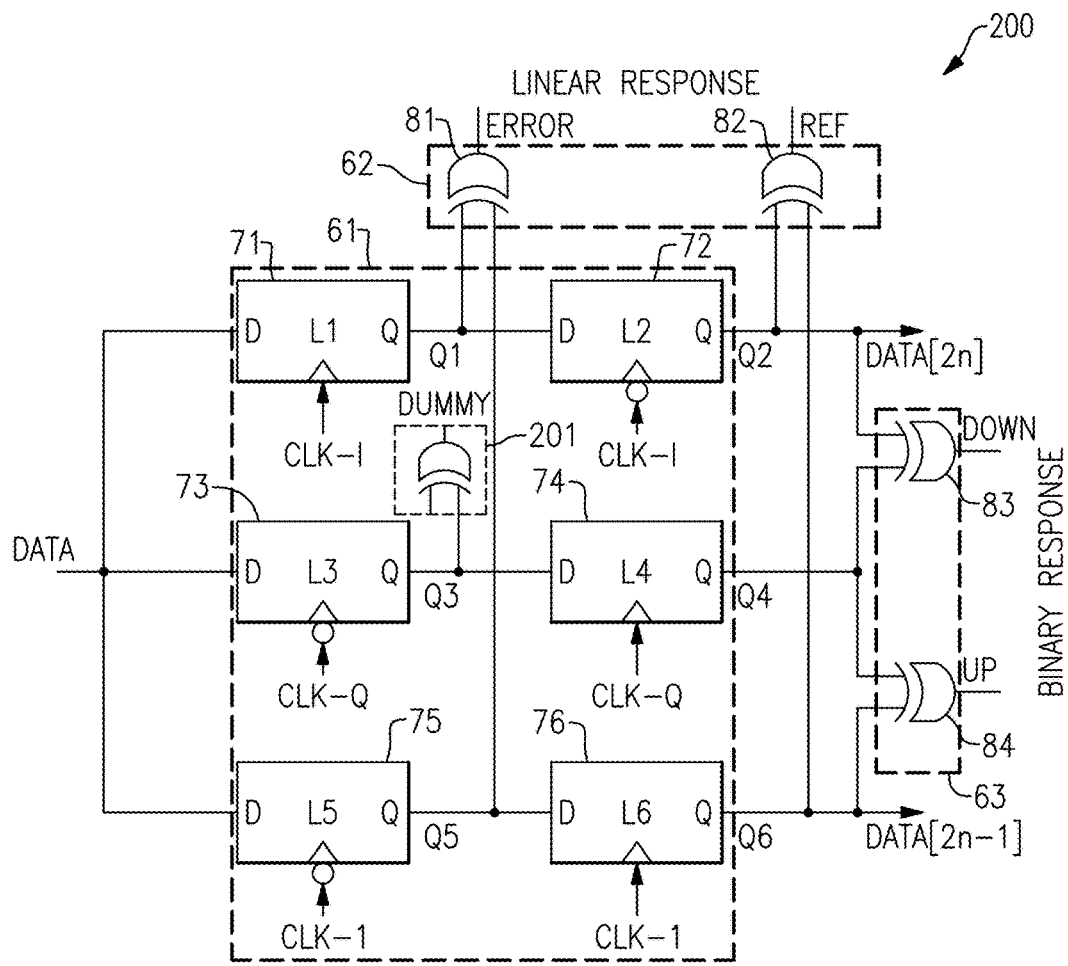
FIG. 7 is a schematic diagram of another embodiment of a dual-response phase detector.

FIG. 7 is a schematic diagram of another embodiment of a dual-response phase detector 200. The dual-response phase detector 200 of FIG. 7 is similar to the dual-response phase detector 60 of FIG. 3, except that the dual-response phase detector 200 includes a dummy circuit 201 (implemented using dummy XOR gate, in this example) to provide matching of the loads driven by the latches 71, 73, and 75.

Figure 8A:
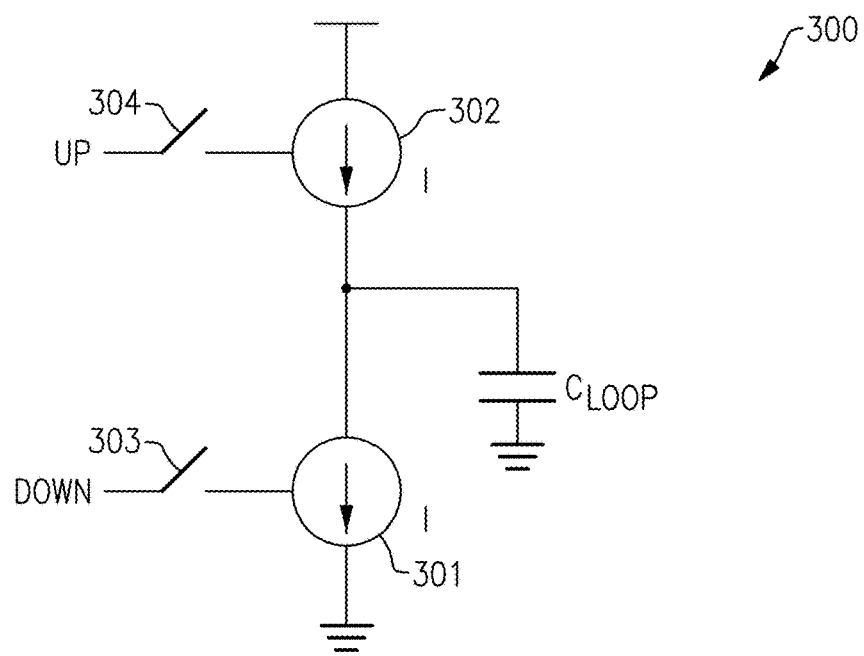
FIG. 8A is a schematic diagram of one example of an integral filter gain circuit for processing a binary response of a dual-response phase detector.

FIG. 8A is a schematic diagram of one example of an integral filter gain circuit 310 for processing a binary response of a dual-response phase detector. The integral filter gain circuit 310 includes a down current source 301, an up current source 302, a down input switch 303, and an up input switch 304. When the down input switch 303 is closed, the down signal DOWN controls activation of the down current source 301 to discharge the loop capacitor $C_{LOOP}$. Additionally, when the up input switch 304 is closed, the up signal UP controls activation of the up current source 302 to charge the loop capacitor $C_{LOOP}$. In this example, the down current source 301 and the up current source 302 source a current I, in this example.

The integral filter gain circuit 300 can be used to adjust a loop filter voltage based on a binary response of a dual-response phase detector. Although FIG. 8A illustrates one example of an integral filter gain circuit for processing a binary response, other implementations are possible.

Figure 8B:
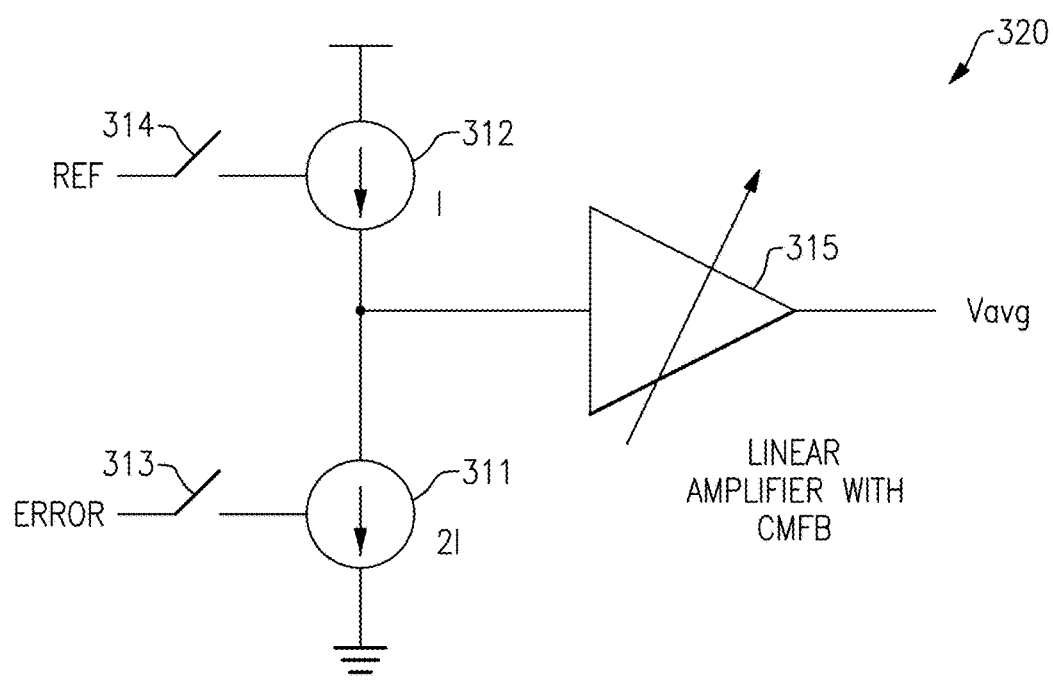
FIG. 8B is a schematic diagram of one example of a proportional filter gain circuit for processing a linear response of a dual-response phase detector.

FIG. 8B is a schematic diagram of one example of a proportional filter gain circuit 320 for processing a linear response of a dual-response phase detector. The proportional filter gain circuit 320 includes an error current source 311, a reference current source 312, an error input switch 313, a reference input switch 314, and a linear amplifier 315. When the error input switch 313 is closed, the error signal ERROR controls activation of the error current source 311 to discharge an input to the linear amplifier 315. Additionally, when the reference input switch 314 is closed, the reference signal REF controls activation of the reference current source 312 to charge the input to the linear amplifier 315. In this example, the reference current source 312 sources a current I and the error current source 311 sources a current that is about 2*I, in this example. The linear amplifier 315 is implemented with common-mode feedback (CMFB) in this embodiment. The linear amplifier 315 generates an average voltage Vavg that controls a loop filter of a CDR circuit.

Accordingly, the proportional filter gain circuit 320 can be used to adjust a loop filter voltage based on a linear response of a dual-response phase detector. Although FIG. 8B illustrates one example of a proportional filter gain circuit for processing a linear response, other implementations are possible.

APPLICATIONS

Devices employing the above described schemes can be implemented into various electronic devices. Examples of electronic devices include, but are not limited to, consumer electronic products, parts of the consumer electronic products, electronic test equipment, communication infrastructure, etc. For instance, phase detectors for clock and data recovery can be used in a wide range of communication systems, including, but not limited to, servers, optical transceivers, base stations, mobile devices, and computers. The teachings herein are applicable to communication systems operating over a wide range of frequencies. A wide range of consumer electronics products can also include a phase detector for clock and data recovery applications. Furthermore, electronic devices can include unfinished products, including those for industrial, medical and automotive applications.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A phase detector for a clock and data recovery (CDR) circuit, wherein the phase detector comprises:
    sampling circuitry configured to generate a plurality of samples of an input data signal based on timings of a plurality of clock signals, wherein the sampling circuitry comprises a first plurality of latches including at least three latches configured to sample the input signal and further comprises a second plurality of latches each configured to receive a respective output from the first plurality of latches;

a binary response circuit configured to process the plurality of samples to generate a plurality of binary output signals providing a binary detector response; and a linear response circuit configured to process the plurality of samples to generate a plurality of linear output signals providing a linear detector response, wherein the phase detector is configured to generate one or more data output signals based on the plurality of samples to thereby recover data from the input data signal.

2. The phase detector of claim 1, wherein the sampling circuitry comprises a first latch configured to sample the input data signal, a second latch configured to sample an output of the first latch, a third latch configured to sample the input data signal, a fourth latch configured to sample an output of the third latch, a fifth latch configured to sample the input data signal, and a sixth latch configured to sample an output of the fifth latch.

3. The phase detector of claim 2, wherein the one or more data output signals comprises a first data output signal generated based on the output of the second latch and a second data output signal generated based on the output of the sixth latch.

4. The phase detector of claim 2, wherein the plurality of binary output signals comprises an up signal generated based on an exclusive or operation of the output of the fourth latch and the output of the sixth latch, and a down signal generated based on an exclusive or operation of the output of the second latch and the output of the fourth latch.

5. The phase detector of claim 2, wherein the plurality of linear output signals comprises an error signal generated based on an exclusive or operation of the output of the first latch and the output of the fifth latch, and a reference signal generated based on an exclusive or operation of the output of the second latch and the output of the sixth latch.

6. The phase detector of claim 2, wherein the plurality of clock signals includes an in-phase (I) clock signal and a quadrature-phase (Q) clock signal, wherein the first latch is triggered by a positive edge of the I clock signal, the second latch is triggered by a negative edge of the I clock signal, the third latch is triggered by a negative edge of the Q clock signal, the fourth latch is triggered by a positive edge of the Q clock signal, the fifth latch is triggered by the negative edge of the I clock signal, and the sixth latch is triggered by the positive edge of the I clock signal.

7. The phase detector of claim 2, wherein the sampling circuitry further comprises a dummy circuit electrically coupled to the output of the third latch and configured to match an output load of the third latch to at least one of an output load of the first latch or an output load of the fifth latch.

8. The phase detector of claim 1, wherein the plurality of clock signals includes an in-phase (I) clock signal and a quadrature-phase (Q) clock signal, wherein the binary response circuit is configured to generate the plurality of binary output signals based on a first sample taken at a negative edge of the I clock signal, a second sample taken at a positive edge of the Q clock signal, and a third sample taken at a positive edge of the I clock signal.

9. A clock and data recovery (CDR) circuit comprising:
a phase detector comprising:
sampling circuitry configured to generate a plurality of samples of an input data signal based on timings of a plurality of clock signals;
a binary response circuit configured to process the plurality of samples to generate a plurality of binary output signals providing a binary detector response; and
a linear response circuit configured to process the plurality of samples to generate a plurality of linear output signals providing a linear detector response,
wherein the phase detector is configured to generate one or more data output signals based on the plurality of samples;
a controllable oscillator having a frequency of oscillation controlled by the plurality of binary output signals and the plurality of linear output signals; and
wherein the controllable oscillator is configured to generate an output clock signal operable to control the timings of the plurality of clock signals.

10. The CDR circuit of claim 9, wherein the sampling circuitry comprises a first latch configured to sample the input data signal, a second latch configured to sample an output of the first latch, a third latch configured to sample the input data signal, a fourth latch configured to sample an output of the third latch, a fifth latch configured to sample the input data signal, and a sixth latch configured to sample an output of the fifth latch.

11. The CDR circuit of claim 10, wherein the one or more data output signals comprises a first data output signal generated based on the output of the second latch and a second data output signal generated based on the output of the sixth latch.

12. The CDR circuit of claim 9, wherein the controllable oscillator comprises a fine control input controlled by the plurality of linear output signals and a coarse control input controlled by the plurality of binary output signals.

13. The CDR circuit of claim 12, wherein the coarse control input has a greater frequency control gain relative to the fine control input.

14. The CDR circuit of claim 12, further comprising an integral filter gain circuit configured to control the coarse control input based on the plurality of binary output signals, and a proportional filter gain circuit configured to control the fine control input based on the plurality of linear output signals.

15. The CDR circuit of claim 9, wherein the controllable oscillator comprises a voltage controlled oscillator (VCO).

16. The CDR circuit of claim 9, wherein the plurality of clock signals includes an in-phase (I) clock signal and a quadrature-phase (Q) clock signal, and wherein the CDR circuit further includes a polyphase filter configured to generate the I clock signal and the Q clock signal from the output clock signal.

17. The CDR circuit of claim 9, further comprising a frequency locking loop (FLL) that further controls a coarse control input based on comparing a reference clock signal to a divided version of the output clock signal.

18. A method of clock and data recovery, the method comprising:
generating a plurality of samples of an input data signal based on timings of a plurality of clock signals using sampling circuitry;
processing the plurality of samples to generate a binary detector response;
processing the plurality of samples to generate a linear detector response;
controlling a frequency of oscillation of a controllable oscillator based on the binary detector response and the linear detector response;

recovering data from the input data signal by generating one or more data output signals based on the plurality of samples;

controlling a fine control input of the controllable oscillator based on the linear detector response; and controlling a coarse control input of the controllable oscillator based on the binary detector response.

19. The method of claim 18, wherein:

fewer than eight latches are used for generating the plurality of samples.

20. The method of claim 18, wherein:

the plurality of samples are generated using six latches with three of the six latches configured to receive the input data signal.

* * * * *